(12) United States Patent  (10) Patent No.: US 8,497,207 B2
Yun et al.  (45) Date of Patent: Jul. 30, 2013

(54) METHODS OF FORMING SEMICONDUCTOR DEVICES INCLUDING LANDING PADS FORMED BY ELECTROLESS PLATING

(75) Inventors: Jong-ho Yun, Suwon-si (KR); Gil-heyun Choi, Seoul (KR); Jong-myeong Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 12/829,776

(22) Filed: Jul. 2, 2010

(65) Prior Publication Data

US 2011/0003476 A1 Jan. 6, 2011

(30) Foreign Application Priority Data

Jul. 3, 2009 (KR) ........................ 10-2009-0060833

(51) Int. Cl.
*H01L 21/00* (2006.01)

(52) U.S. Cl.
USPC ............................ 438/675; 438/622; 438/637

(58) Field of Classification Search
USPC ......................................... 438/675, 637, 622
See application file for complete search history.

(56) References Cited

U.S. PATENT DOCUMENTS

| | | | | |
|---|---|---|---|---|
| 5,739,579 A * | 4/1998 | Chiang et al. | ............ | 257/635 |
| 5,817,572 A * | 10/1998 | Chiang et al. | ............ | 438/624 |
| 6,660,630 B1 * | 12/2003 | Chang et al. | ............ | 438/637 |
| 6,680,540 B2 * | 1/2004 | Nakano et al. | ............ | 257/758 |
| 6,713,835 B1 * | 3/2004 | Horak et al. | ............ | 257/522 |
| 6,800,522 B2 * | 10/2004 | Lee | ............ | 438/253 |
| 7,030,030 B2 * | 4/2006 | Suzuki et al. | ............ | 438/720 |
| 7,132,326 B2 * | 11/2006 | Lee et al. | ............ | 438/253 |
| 7,247,573 B2 * | 7/2007 | Spandre | ............ | 438/714 |
| 7,414,314 B2 * | 8/2008 | Abe | ............ | 257/751 |
| 7,776,683 B2 * | 8/2010 | Tran et al. | ............ | 438/241 |
| 8,093,724 B2 * | 1/2012 | Hasunuma | ............ | 257/773 |
| 8,119,512 B1 * | 2/2012 | Lee | ............ | 438/597 |
| 2004/0061229 A1 * | 4/2004 | Moslehi | ............ | 257/758 |
| 2004/0232520 A1 * | 11/2004 | Tsau | ............ | 257/532 |
| 2005/0051899 A1 * | 3/2005 | Nakatani et al. | ............ | 257/751 |
| 2005/0118800 A1 * | 6/2005 | Brakensiek et al. | ............ | 438/633 |
| 2005/0142863 A1 * | 6/2005 | Spandre | ............ | 438/640 |
| 2005/0151224 A1 * | 7/2005 | Abe | ............ | 257/510 |
| 2007/0087562 A1 * | 4/2007 | Lee et al. | ............ | 438/638 |
| 2007/0123036 A1 * | 5/2007 | Brakensiek et al. | ............ | 438/636 |
| 2007/0241380 A1 * | 10/2007 | Hasunuma | ............ | 257/296 |

(Continued)

FOREIGN PATENT DOCUMENTS

| | | |
|---|---|---|
| JP | 04-307736 A | 10/1992 |
| KR | 1020000044857 A | 7/2000 |
| KR | 100649972 B1 | 11/2006 |
| KR | 100791345 B1 | 12/2007 |

*Primary Examiner* — Laura Menz (74) *Attorney, Agent, or Firm* — Myers Bigel Sibley & Sajovec, PA (57) ABSTRACT

A semiconductor device in which an increase of contact resistance Rc between a metal contact and a plug due to misalignment between the metal contact and the plug can be reduced and the difficulty of a Cu filling process during the process of forming the plug may be reduced. The semiconductor device includes a substrate including an active area and a device isolation layer; a metal contact that is formed on the substrate and is electrically connected to the active area; a landing pad formed on the metal contact by electroless plating; and a plug that is formed on the landing pad and is electrically connected to the metal contact via the landing pad.

11 Claims, 6 Drawing Sheets

U.S. PATENT DOCUMENTS

| | | | |
|---|---|---|---|
| 2008/0293245 A1* | 11/2008 | Abe | 438/675 |
| 2009/0278126 A1* | 11/2009 | Yang et al. | 257/57 |
| 2010/0008152 A1* | 1/2010 | Lee et al. | 365/185.23 |
| 2010/0155949 A1* | 6/2010 | Jain | 257/751 |
| 2010/0181671 A1* | 7/2010 | Park et al. | 257/751 |
| 2010/0283128 A1* | 11/2010 | Chen | 257/620 |
| 2011/0003476 A1* | 1/2011 | Yun et al. | 438/675 |
| 2011/0104865 A1* | 5/2011 | Uchiyama | 438/396 |
| 2011/0266679 A1* | 11/2011 | Hotta et al. | 257/758 |
| 2011/0284941 A1* | 11/2011 | Uchiyama | 257/301 |
| 2012/0132972 A1* | 5/2012 | Hasunuma | 257/296 |

* cited by examiner

METHODS OF FORMING SEMICONDUCTOR DEVICES INCLUDING LANDING PADS FORMED BY ELECTROLESS PLATING

CROSS-REFERENCE TO RELATED APPLICATIONS

This application claims the benefit of Korean Patent Application No. 10-2009-0060833, filed on Jul. 3, 2009, in the Korean Intellectual Property Office, the disclosure of which is incorporated herein in its entirety by reference.

BACKGROUND

The inventive concept relates to a semiconductor device, and more particularly, to a semiconductor device which is capable of reducing an increase in contact resistance Rc between a metal contact and a plug, and reducing the difficulty in forming the plug.

As semiconductor devices are miniaturized, the pitch of metal contacts may be decreased. However, since it can be difficult to reduce a photo misalignment margin in a photolithography process below a predetermined level, misalignment between a metal contact and a plug formed thereon can be generated. In this regard, misalignment may occur in practice.

Misalignment may cause increase in leakage current between the metal contact and the plug, deterioration of a breakdown voltage, and deterioration of time dependent dielectric breakdown (TDDB). In order to address the problem, a blocking SiN hole (BSH) scheme can be used. Since the metal contact and the plug are separated by a silicon nitride (SiN) layer, the increase of the leakage current or the deterioration of the breakdown voltage may be prevented or reduced even if the metal contact and the plug are misaligned.

Generally, however, misalignment of the metal contact and the plug can still occur despite use of the BSH scheme, and the width of the contact surface between the metal contact and the plug can be reduced and thus the contact resistance Rc between the metal contact and the plug may be increased. In addition, since a Cu filling process is performed for two layers—two metal contacts—when forming the plug, the Cu filling process is performed on a dual damascene pattern, which may increase the difficulty of the Cu filling process.

SUMMARY

According to an aspect of the inventive concept, there is provided a semiconductor device comprising: a substrate comprising an active area and a device isolation layer; a metal contact disposed on the substrate and electrically connected to the active area; a landing pad formed on the metal contact by electroless plating; and a plug disposed on the landing pad and electrically connected to the metal contact via the landing pad.

The landing pad may be broader than the upper surface of the metal contact. The plug may be formed by using a blocking SiN hole (BSH) scheme and a damascene process. The landing pad may comprise a material selected from the group consisting of Co, Ni, Pt, Pd, Rh, Ru, Re, Au, Ag, and alloys thereof, or at least one impurity selected from the group consisting of P, B, W, Mn, and Mo may be included in the material. The landing pad may have a double-layer or multi-layer structure.

The semiconductor device may further comprise an electroless plating plug that is formed by electroless plating and disposed between the landing pad and the plug.

According to another aspect of the inventive concept, there is provided a semiconductor device comprising: a plurality of metal contacts that are electrically connected to an active area of a substrate, arranged in a zigzag manner and surrounded by an interlayer insulating layer; a cobalt (Co) landing pad disposed on each of the metal contacts, wherein the Co landing pad is broader than the upper surface of each of the metal contacts; and a plug that is formed on each of the landing pads by using a BSH scheme and a damascene process, and is electrically connected to the corresponding metal contact via the landing pad.

The semiconductor device including a landing pad, which is formed by electroless plating according to the inventive concept, may prevent an increase in contact resistance Rc which is generated by misalignment between a metal contact and a plug, since the landing pad is formed on the metal contact by using electroless plating.

Also, as an electroless plating plug is formed on the landing pad by electroless plating, a Cu filling process may be performed by using a single damascene pattern, and the degree of difficulty of the Cu filling process for forming the plug may be reduced.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below. However, as used herein, and as conventionally used, the "vertical" direction is generally orthogonal to the face of the substrate regardless of its orientation, whereas the "horizontal" direction is generally parallel to (extending along) the face of the substrate.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
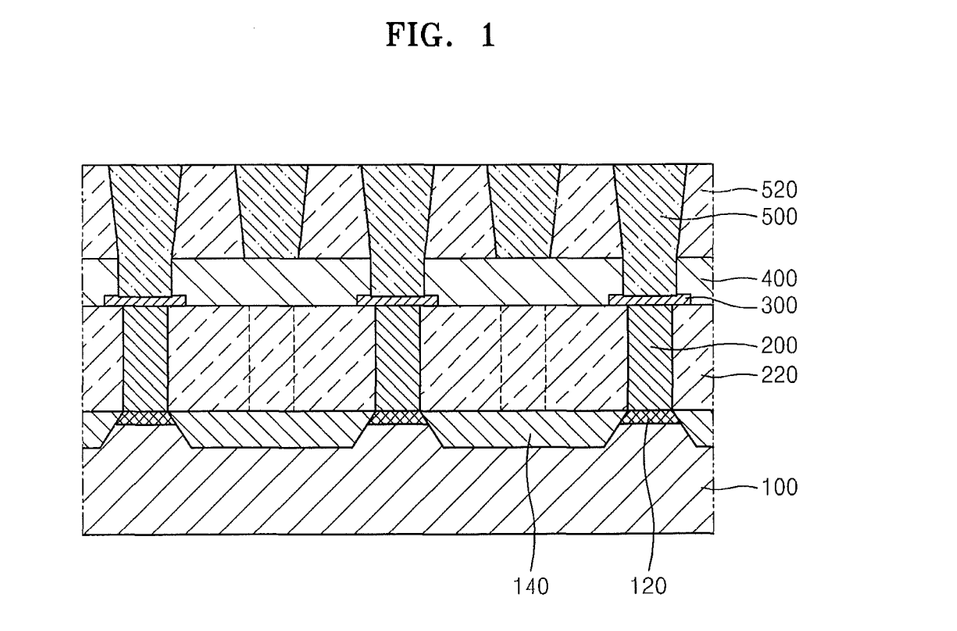
FIG. 1 is a cross-sectional view illustrating a semiconductor device including a landing pad that is formed by electroless plating, according to an embodiment of the inventive concept.

FIG. 1 is a cross-sectional view illustrating a semiconductor device including a landing pad that is formed by electroless plating, according to an embodiment of the inventive concept.

Referring to FIG. 1, the semiconductor device according to the present embodiment includes a substrate 100, a metal contact 200 that is electrically connected to an active area 120 formed in the substrate 100, a landing pad 300 that is formed on the metal contact 200 by electroless plating, and a plug 500 that is formed on the landing pad 300.

A plurality of device isolation layers 140 are formed in an upper portion of the substrate 100, and the active area 120 is disposed between the device isolation layers 140 close to the surface of the substrate 100. The active area 120 may be a source and/or drain area. The metal contact 200 is formed on the substrate 100 and is electrically connected to the active area 120. The metal contact 200 may be formed by forming a contact hole in a first intermediate insulating layer 220 and filling the contact hole with a metal such as tungsten (W).

Also, in FIG. 1, dotted lines denote other metal contacts 200 formed in the first intermediate insulating layer 220. In this regard, the metal contacts 200 are disposed in a zigzag manner in the first intermediate insulating layer 220, and thus other metal contacts 200 adjacently located in front of and behind the metal contacts 200 illustrated in FIG. 1 are not seen because FIG. 1 is a cross-sectional view. The metal contacts 200 not illustrated in FIG. 1 will be described in detail with reference to FIG. 5.

The landing pad 300 is formed on the metal contact 200 by electroless plating. The landing pad 300 may be formed of cobalt (Co) but is not limited thereto. For example, the landing pad 300 may include a material selected from the group consisting of Ni, Pt, Pd, Rh, Ru, Re, Au, Ag, and alloys thereof, and the material may include at least one impurity selected from the group consisting of P, B, W, Mn, and Mo. Furthermore, the landing pad 300 may also be a double-layer or multi-layer structure, instead of a single layer structure.

In some embodiments, a capping layer (of Co) is formed in the upper portion of a Cu plug to reduce diffusion of Cu. Thus, if the landing pad 300 is formed of Co, diffusion of Cu can also be reduced at the same time.

The landing pad 300 is formed on the metal contact 200 in order to provide a sufficient contact surface between the plug 500 and the metal contact 200 and thus to reduce the contact resistance Rc between the plug 500 and the metal contact 200. Accordingly, the surface area of the landing pad 300 needs to be greater than an upper surface of the metal contact 200. For example, the width of the landing pad 300 may be 1.5 to 2 times the width of the upper surface of the metal contact 200, but is not limited thereto.

The plug 500 is formed on the landing pad 300 by using a Cu filling process by using a damascene pattern. Meanwhile, a blocking SiN hole (BSH) scheme is used so that all sides of lower portions of the plug 500 are completely surrounded by a silicon nitride layer 400, and only left and right sides of upper portions of the plug 500 are surrounded by a second interlayer insulating layer 520, thereby reducing leakage current LKG or deterioration of a breakdown voltage BV.

In the BSH scheme, when forming a plug pattern, that is, when forming a hole for forming a plug, first an upper insulating layer on a silicon nitride layer is etched using the silicon nitride layer as a stopper. Next, the silicon nitride layer on a metal contact is etched using a reticle or an etching mask used for forming the metal contact. That is, through the BSH scheme, an upper surface of the metal contact is exposed. Afterward the plug on the metal contact is formed by Cu filling and the metal contact and the plug are connected each other. By forming the plug using the BSH scheme, the leakage current LKG or the deterioration of the breakdown voltage BV may be reduced.

In the semiconductor device according to the current embodiment of the inventive concept, the landing pad 300 formed by electroless plating, which may be a cobalt landing pad, is formed on the metal contact 200 in order to provide a broad contact surface between the metal contact 200 and the plug 500. Accordingly, contact resistance Rc between the plug 500 and the metal contact 200 is significantly reduced even when misalignment occurs between the plug 500 and the metal contact 200.

FIGS. 2A through 2E are cross-sectional views illustrating a method of manufacturing the semiconductor device of FIG. 1.

Figure 2A:
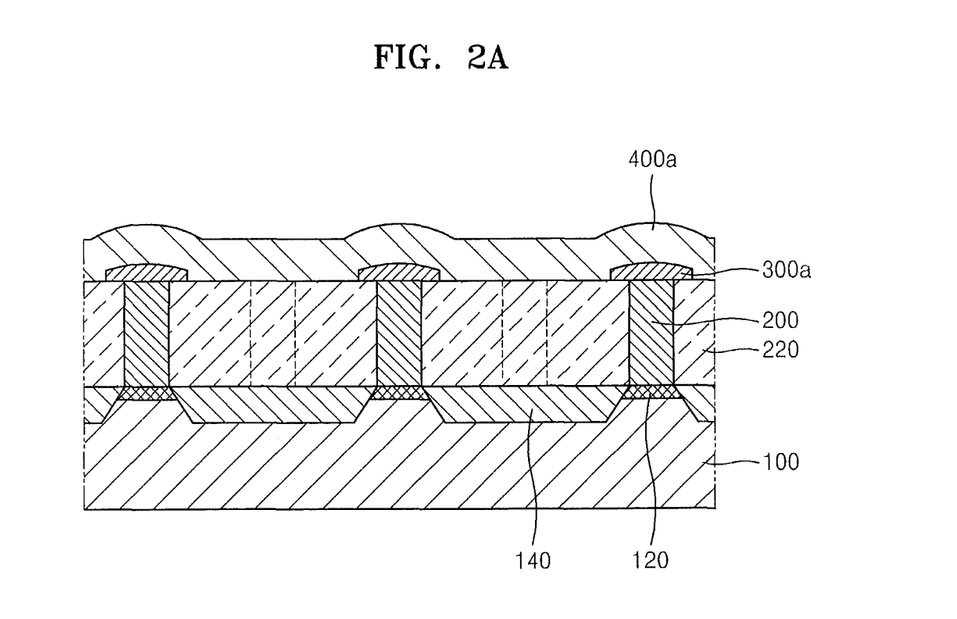
FIGS. 2A through 2E are cross-sectional views illustrating a method of manufacturing the semiconductor device of FIG. 1.

Referring to FIG. 2A, the metal contact 200 that is connected to the active area 120 in the substrate 100, for example, a tungsten metal contact, is planarized with the first intermediate insulating layer 220 by using a chemical mechanical polishing (CMP) method, and a landing pad 300a is formed on an upper surface of the metal contact 200 by electroless plating.

The landing pad 300a may include an electroless plating metal, for example, a material selected from the group consisting of Co, Ni, Pt, Pd, Rh, Ru, Re, Au, Ag, and alloys thereof. In addition, one impurity selected from the group consisting of P, B, W, Mn, and Mo may be included in the material of the landing pad 300a.

However, in order to reduce diffusion of Cu, the landing pad 300a may be formed of Co. Also, the landing pad 300a may be a double-layer structure or a multi-layer structure, instead of a single layer structure. The upper surface area of the landing pad 300a may be broader than the upper surface of the metal contact 200 so that a broad contact surface between the landing pad 300a and a plug which is to be formed later is provided.

After forming the landing pad 300a, a silicon nitride layer 400a, which functions as a stopper, that is, an etching prevention layer during an etching operation, is formed on the landing pad 300a by deposition. As described above, the dotted lines denote the other metal contacts 200 formed in the first intermediate insulating layer 220.

Figure 2B:
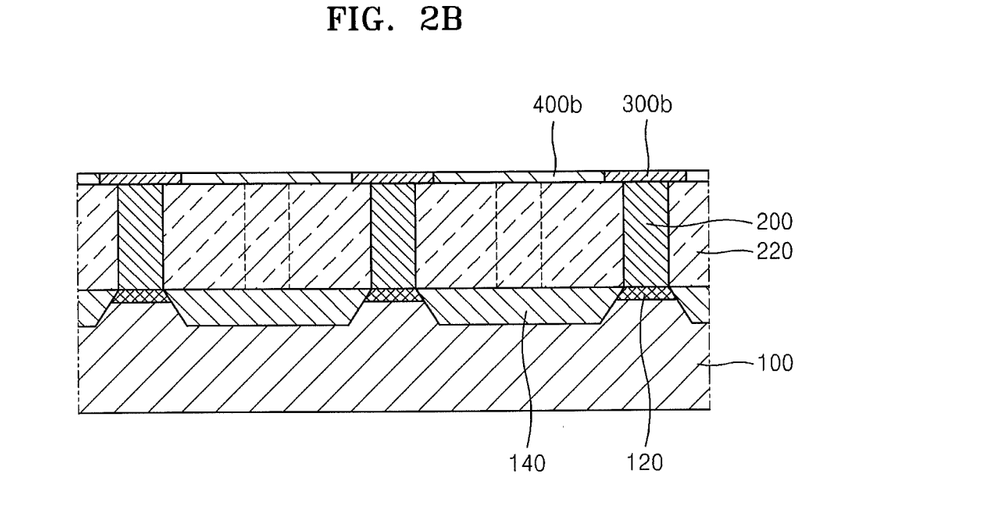

Referring to FIG. 2B, after forming the silicon nitride layer 400a, the upper surface of the resultant structure is planarized by CMP to remove most of the silicon nitride layer 400a. Remaining portions of the silicon nitride layer 400a constitute a landing pad 300b having a minimum thickness and a silicon nitride layer 400b having the same thickness as the landing pad 300b.

Figure 2C:
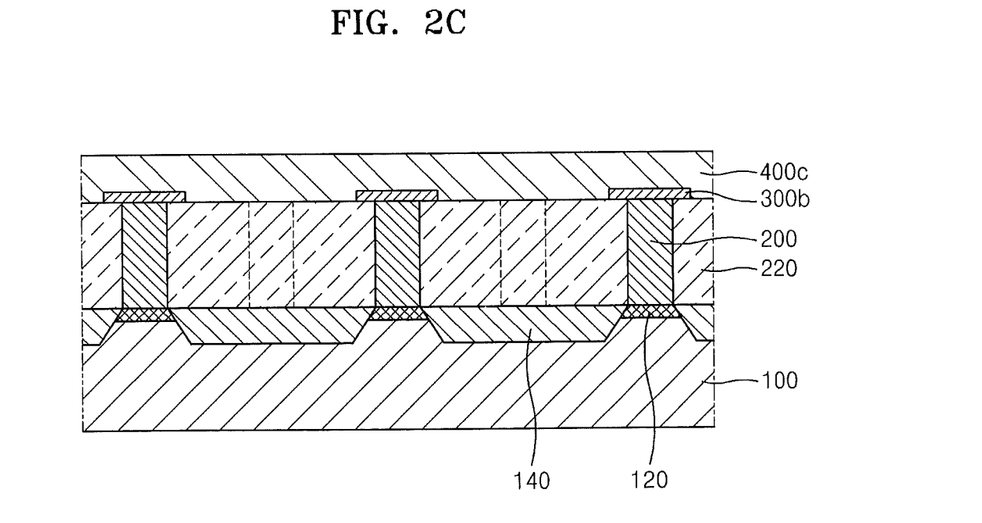

Referring to FIG. 2C, after the CMP is performed, another silicon nitride layer is formed on the resultant structure, thereby forming a silicon nitride layer 400c having a predetermined thickness. The silicon nitride layer 400c having a predetermined thickness is formed again in order to apply the BSH scheme.

Figure 2D:
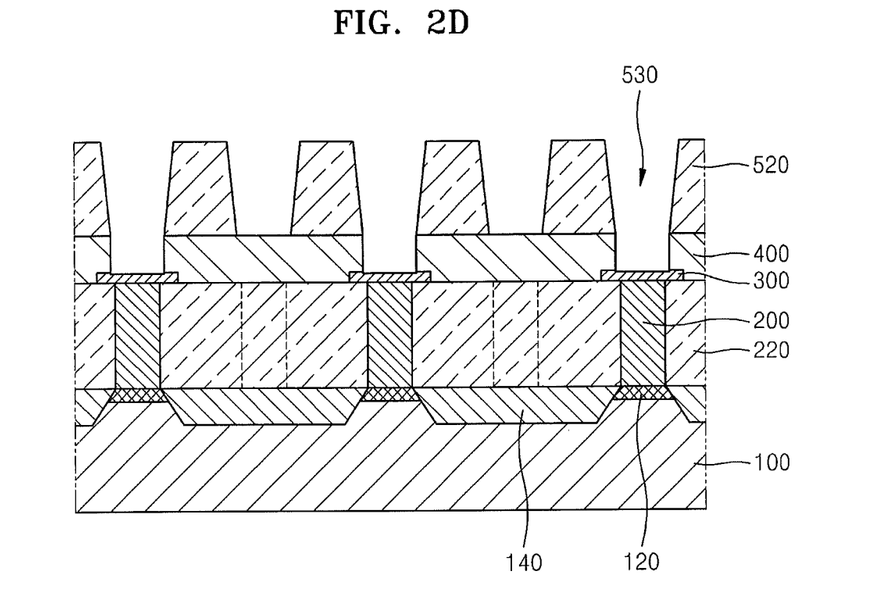

Referring to FIG. 2D, the second interlayer insulating layer 520 is formed of an insulation material such as a silicon oxide, on the silicon nitride layer 400c, and then the second interlayer insulating layer 520 and the silicon nitride layer 400c are etched, thereby forming a hole 530 for forming a plug. The hole 530 is formed using the BSH scheme. In detail, when forming the hole 530 for forming the plug, the second interlayer insulating layer 520 on the silicon nitride layer 400c is etched first using the silicon nitride layer 400c as a stopper. Next, the silicon nitride layer 400c on the landing pad 300b is etched using a reticle or an etching mask used for forming the metal contact 200. That is, through the BSH scheme, an upper surface of the landing pad 300 is exposed. As described above, by forming the hole 530 using the BSH scheme, the leakage current LKG or the deterioration of the breakdown voltage BV due to misalignment of the metal contact 200 and the plug may be reduced.

Accordingly, the hole 530 has portions that correspond to the thickness of the second interlayer insulating layer 520 and the thickness of the silicon nitride layer 400 less the thickness of the landing pad 300 and portions that correspond to the thickness of the second interlayer insulating layer 520, thereby having steps in a lower portion thereof. While the silicon nitride layer 400 is etched so that an upper surface of the metal contact 200 is exposed by using the BSH scheme according to the conventional art, the landing pad 300 is formed on the metal contact 200 according to the current embodiment, and thus as the silicon nitride layer 400 is etched, the landing pad 300 is exposed.

Figure 2E:
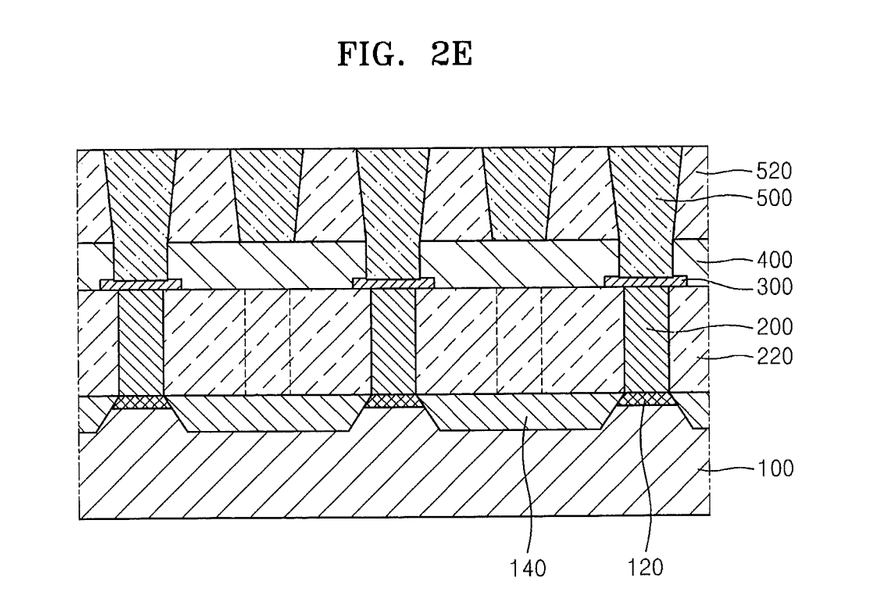

Referring to FIG. 2E, Cu is filled in the hole 530 by using a Cu filling process such as electro chemical plating (ECP) and is planarized through CMP, thereby forming a Cu plug 500. According to the current embodiment, since the portion of the hole 530 formed in the silicon nitride layer 400 also needs to be filled with Cu through the Cu filling process, a Cu filling process for a dual damascene pattern is performed.

Meanwhile, although not illustrated in the drawings, a barrier metal may be further formed into the hole 530 before the Cu filing process. Subsequent processes after the Cu filling process are the same as the manufacturing process of conventional semiconductor devices and thus a description thereof will not be provided.

Figure 3:
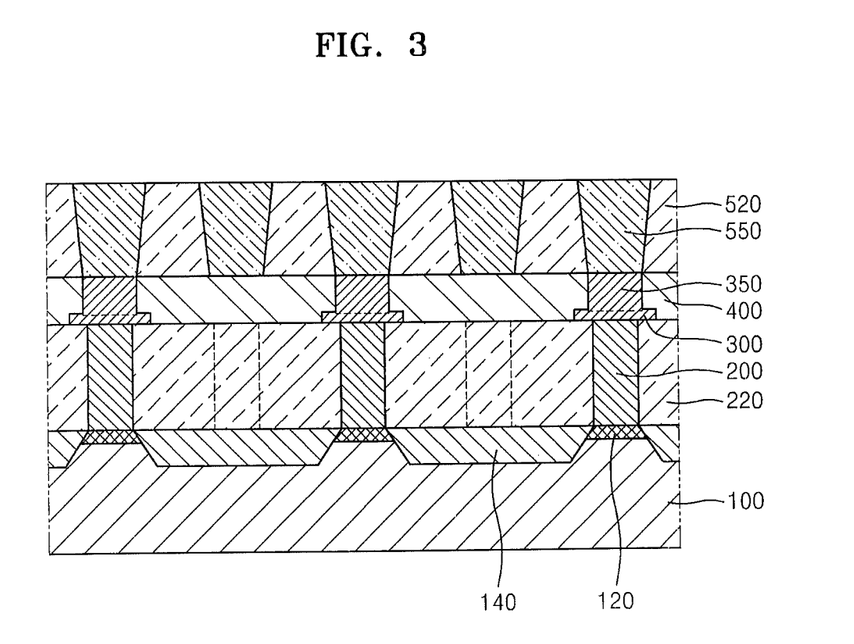
FIG. 3 is a cross-sectional view illustrating a semiconductor device including a landing pad that is formed by electroless plating, according to another embodiment of the inventive concept.

FIG. 3 is a cross-sectional view illustrating a semiconductor device including a landing pad that is formed by electroless plating, according to another embodiment of the inventive concept.

Referring to FIG. 3, the semiconductor device according to the current embodiment is similar to the semiconductor device of FIG. 1, but differs in that an electroless plating plug 350 is further formed between the landing pad 300 and a plug 550 by electroless plating. That is, in the semiconductor device according to the current embodiment, a portion of a hole formed in the silicon nitride layer 400 is not filled with Cu through the Cu filling process but with an electroless plating material such as Co by electroless plating.

As the electroless plating plug 350 is formed in the portion of the hole 530 in the silicon nitride layer 400, a lower step in the hole is not present. Thus the Cu filling process is applied not to a dual damascene pattern but to a single damascene pattern when filling the hole with Cu. Accordingly, the degree of difficulty of the Cu filling process for forming a plug may be significantly reduced.

Like the landing pad 300 described above, the electroless plating plug 350, which is formed through the electroless plating, includes a material selected from the group consisting of Co, Ni, Pt, Pd, Rh, Ru, Re, Au, Ag, and alloys thereof, and at least one impurity selected from the group consisting of P, B, W, Mn, and Mo may be included in the material or the alloys thereof. However, in order to reduce diffusion of Cu, the electroless plating plug 350 may be formed of Co. Also, the electroless plating plug 350 may be a double-layer or multi-layer structure, instead of a single layer structure.

As described above, according to the semiconductor device of the current embodiment, in addition to the reduced contact resistance Rc due to the landing pad 300, an electroless plating plug 350 is formed in a portion of the hole formed in the silicon nitride layer, and thus a Cu filling process may be performed using a single damascene pattern, thus significantly reducing the degree of difficulty of the Cu filling process for forming a plug.

Figure 4A:
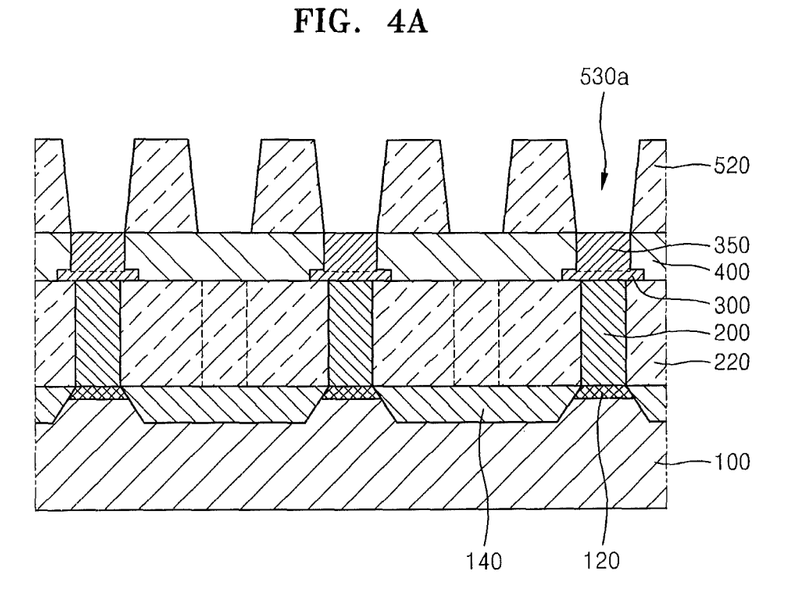
FIGS. 4A and 4B are cross-sectional views illustrating a method of manufacturing the semiconductor device of FIG. 3.
Figure 4B:
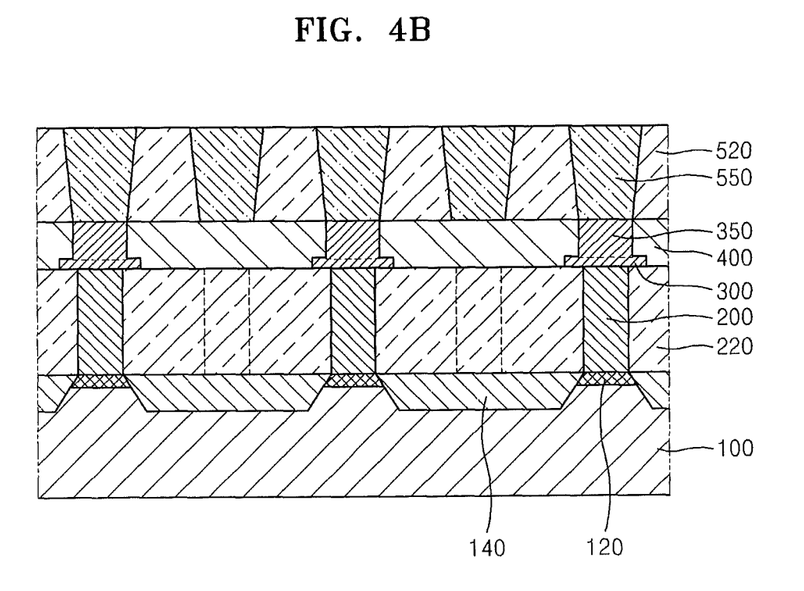

FIGS. 4A and 4B are cross-sectional views illustrating a method of manufacturing the semiconductor device of FIG. 3.

Steps of the method of manufacturing the semiconductor device of FIG. 3 that are the same as those of the method of manufacturing the semiconductor device of FIG. 1 will not be repeated. Accordingly, description of processes of the method of manufacturing the semiconductor device of FIG. 3, which are the same as the processes described with reference with FIGS. 2A through 2D, will not be provided here.

Referring to FIG. 4A, after a hole 530 for forming a plug is formed by using the BSH scheme, the portion of the hole 530 formed in the silicon nitride layer 400 that exposes the landing pad 300 is filled with an electroless plating material such as Co through electroless plating, thereby forming the electroless plating plug 350. Thus, as the electroless plating plug 350 is formed in the portion of the hole 530 formed in the silicon nitride layer 400, a step in the lower portion of the hole 530a for forming a plug is removed.

Referring to FIG. 4B, Cu is filled in the hole 530a above the electroless plating plug 350 and above the silicon nitride layer 400, and the resultant product is planarized by CMP, thereby forming a plug 550. Since there is no step in the lower portion of the hole 530a for forming a plug as described above, Cu can be easily filled in the hole 530a by applying the conventional Cu filling process to a single damascene pattern, and accordingly, as described above, the degree of difficulty of the Cu filling process can be significantly reduced for forming a plug. Subsequent processes after the Cu filling process are the same as the method of manufacturing a conventional semiconductor device, and thus description thereof will not be provided.

Figure 5:
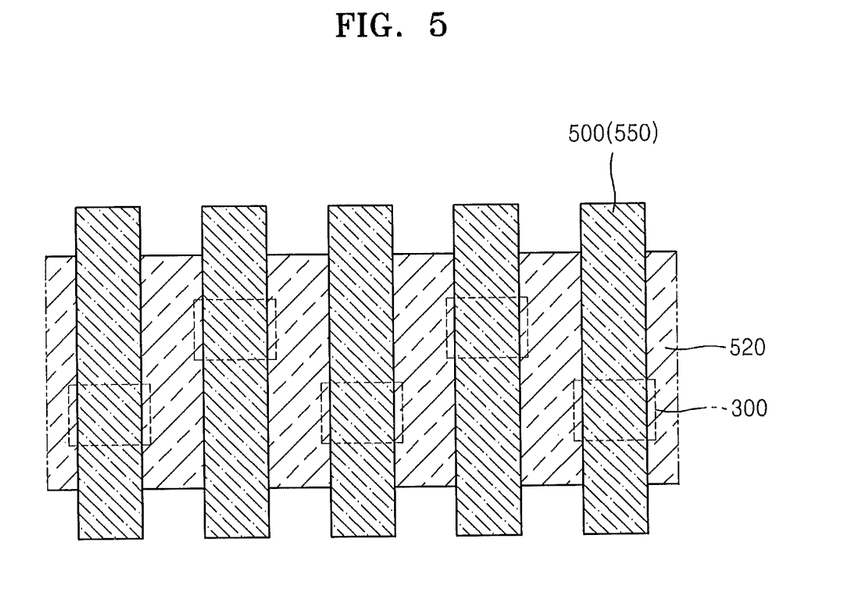
FIG. 5 is a plan view illustrating a position where a cobalt landing pad is formed in the semiconductor device of FIG. 1 or FIGS. 2A through 2E.

FIG. 5 is a plan view illustrating positions where a Co landing pad is formed in the semiconductor device of FIG. 1 or FIG. 3, according to an embodiment of the inventive concept.

Referring to FIG. 5, a top surface of the semiconductor device after forming the plug 500 or 550 is illustrated. In detail, a plurality of the plugs 500 or 550 extend in a direction on the upper surface of the semiconductor device, and the second interlayer insulating layer 520 exposed between the plugs 500 or 550 are illustrated in FIG. 5. Squares denoted with dotted lines indicate the positions of the landing pads 300. The landing pads 300 are arranged in a zigzag manner as illustrated in FIG. 5.

The landing pads 300 are disposed in a zigzag manner because the metal contacts 200 are disposed in a zigzag manner to provide a margin between the metal contacts 200. That is, the metal contacts 200 are disposed in a zigzag manner, and thus the landing pads 300 formed on the metal contacts 200 are also disposed in a zigzag manner.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
    forming a plurality of metal contacts that pass through a first interlayer insulating layer that is formed on a substrate, and forming a plurality of landing pads on upper surfaces of the plurality of metal contacts by electroless plating;
    forming a single etching prevention layer directly on the plurality of landing pads and the first interlayer insulating layer;
    forming a second interlayer insulating layer on the etching prevention layer;
    forming a hole in the second interlayer insulating layer and the etching prevention layer that exposes an upper surface of one of the plurality of landing pads; and
    forming a plug by burying the hole using a damascene process;
    wherein the plurality of the metal contacts are arranged on the substrate in a zigzag arrangement; and
    wherein forming the hole comprises forming the hole, which surrounds a lower portion of the plug, using a blocking SiN hole (BSH) scheme.

2. The method of claim 1, wherein each of the plurality of landing pads is wider than the upper surfaces of the respective ones of the plurality of metal contacts.

3. The method of claim 1, wherein each of the plurality of landing pads comprises a material selected from the group consisting of Co, Ni, Pt, Pd, Rh, Ru, Re, Au, Ag, and alloys thereof, or the material or the alloys including at least one impurity selected from the group consisting of P, B, W, Mn, and Mo.

4. The method of claim 1, wherein each of the plurality of landing pads comprises a bi-layer or a multi-layer.

5. The method of claim 1, wherein forming each of the plurality of landing pads comprises:
    forming a first landing pad by electroless plating;
    forming an insulating layer formed of the same material as the etching prevention layer, on the first interlayer insulating layer and the first landing pad; and
    forming the landing pad having a predetermined thickness by planarizing the insulating layer and the first landing pad using a chemical mechanical polishing (CMP) process.

6. The method of claim 1, wherein the forming a plug comprises:
    forming an electroless plating plug on the landing pad formed in the hole formed in the etching prevention layer through an electroless plating method; and
    forming the plug on the electroless plating plug.

7. The method of claim 6, wherein the plug formed on the electroless plating plug is formed using a single damascene process.

8. The method of claim 6, wherein the electroless plating plug comprises a material selected from the group consisting of Co, Ni, Pt, Pd, Rh, Ru, Re, Au, Ag, and alloys thereof, or the material or the alloys including at least one impurity selected from the group consisting of P, B, W, Mn, and Mo.

9. The method of claim 1, wherein the forming a hole comprises:
    forming a first hole, having a substantially line type, in the second interlayer insulating layer so as to expose a predetermined portion of the etching prevention layer; and
    forming a second hole in the etching prevention layer so as to expose the one of the plurality of landing pads.

10. The method of claim 9, wherein the etching prevention layer comprises SiN.

11. The method of claim 1, wherein the plurality of the landing pads are arranged in a zigzag arrangement to correspond to the metal contacts.

* * * * *